United States Patent
Schneider

(10) Patent No.: US 7,027,310 B2
(45) Date of Patent: Apr. 11, 2006

(54) ELECTRONIC MONITOR MOUNTING CONFIGURATION

(75) Inventor: Joseph L. Schneider, Chicago, IL (US)

(73) Assignee: Woodward Governor Company, Ft. Collins, CO (US)

( * ) Notice: Subject to any disclaimer, the term of this patent is extended or adjusted under 35 U.S.C. 154(b) by 319 days.

(21) Appl. No.: 10/145,529

(22) Filed: May 14, 2002

(65) Prior Publication Data
US 2003/0214799 A1    Nov. 20, 2003

(51) Int. Cl.
*H05K 7/14* (2006.01)
(52) U.S. Cl. .................. 361/807; 361/809; 361/664; 174/52.1
(58) Field of Classification Search .......... 361/801, 361/807–810, 748, 760, 774, 664; 174/52.1–52.4
See application file for complete search history.

(56) References Cited

U.S. PATENT DOCUMENTS

| | | | | |
|---|---|---|---|---|
| 4,936,783 A | * | 6/1990 | Petersen | 439/70 |
| 4,978,318 A | * | 12/1990 | Wiley et al. | 439/536 |
| 5,135,411 A | * | 8/1992 | Wiley et al. | 439/535 |
| 5,699,221 A | * | 12/1997 | O'Leary et al. | 361/160 |
| 6,111,760 A | * | 8/2000 | Nixon | 361/814 |

FOREIGN PATENT DOCUMENTS

DE    411388    *    1/1995

OTHER PUBLICATIONS

Four Page Product Information Brochure on POW-R-CON Module manufactured by Barber Colman Company, Loves Park, IL 61132.
Two Page Product Information Brochure on DYN3-10100 and DYN3-10150 511 Manual Start Module, manufactured by Barber Colman Company, Loves Park, IL 61132.
Two Page Product Information Brochure on DYNA II SILVERLINE Microprocessor Auto-Synchronizer—DYN2-90200 and DYN2-90300 manufactured by Barber Colman Company, Loves Park, IL 61132.

* cited by examiner

*Primary Examiner*—Kamand Cuneo
*Assistant Examiner*—Dameon E. Levi
(74) *Attorney, Agent, or Firm*—Reinhart Boerner Van Deuren P.C.

(57) ABSTRACT

An apparatus for permitting both base and flush mounting a device to a surface is disclosed. The apparatus comprises a case housing a device and a frame. The frame is configured to attach to the case in both a base mounting and flush mounting configuration.

11 Claims, 5 Drawing Sheets

ELECTRONIC MONITOR MOUNTING CONFIGURATION

TECHNICAL FIELD

This invention relates to an apparatus housing an electrical device.

BACKGROUND OF THE INVENTION

Electronic monitoring devices that incorporate visual and/or audible status and alert functions are commonly mounted to a surface. The devices typically include an electronic circuit board surrounded by a protective case. The primary purpose of the case is to provide structural support and protection for the circuit board. Furthermore the case supplies a means for mounting the device to the surface. The devices are usually mounted either flush to the surface, referred to as "flush mount", or they are mounted above the surface, referred to as "base mount."

The base mount configuration allows the entire package to be added at any time anywhere there is space available. The disadvantage of a base mount configuration is the entire case is exposed making for a less visually appealing package. Flush mounting is much more visually appealing as it hides the majority of the case. The disadvantage of the flush mount configuration is that it must be planned for in advance and it requires much more effort to complete the installation. Flush mounting may be preferred for new control applications while retrofit applications will favor base mount designs. Where it may be required to be base or flush mounted, usually two separate enclosures are needed. It is the intent of this invention to use the same set of components for either base or flush mount configurations.

SUMMARY OF THE INVENTION

It is an object of the invention to provide an apparatus for permitting both base and flush mounting a device to a surface.

In accordance with the invention, the apparatus comprises a case housing a device, and a frame. The frame is configured to attach to the case in both a base mounting and flush mounting configuration.

It is contemplated that a plurality of cooperative snaps secure the frame to the case.

It is further contemplated that the device has a visual display and the case includes an aperture for exposing the visual display. It is contemplated that the device is a monitoring device or a control device.

It is contemplated that the apparatus comprises hooks to retain the device in the housing.

It is further the object of the invention to provide a method of mounting an apparatus to a surface. The method comprises providing a case to house a device and a frame for permitting mounting the case to a surface in both a base mounting configuration and a flush mounting configuration. The frame is interfaced to the case in either a base mounting configuration or flush mounting configuration. The frame is then mounted to the surface in the respective base or flush mounting configuration.

DETAILED DESCRIPTION

Figure 1:
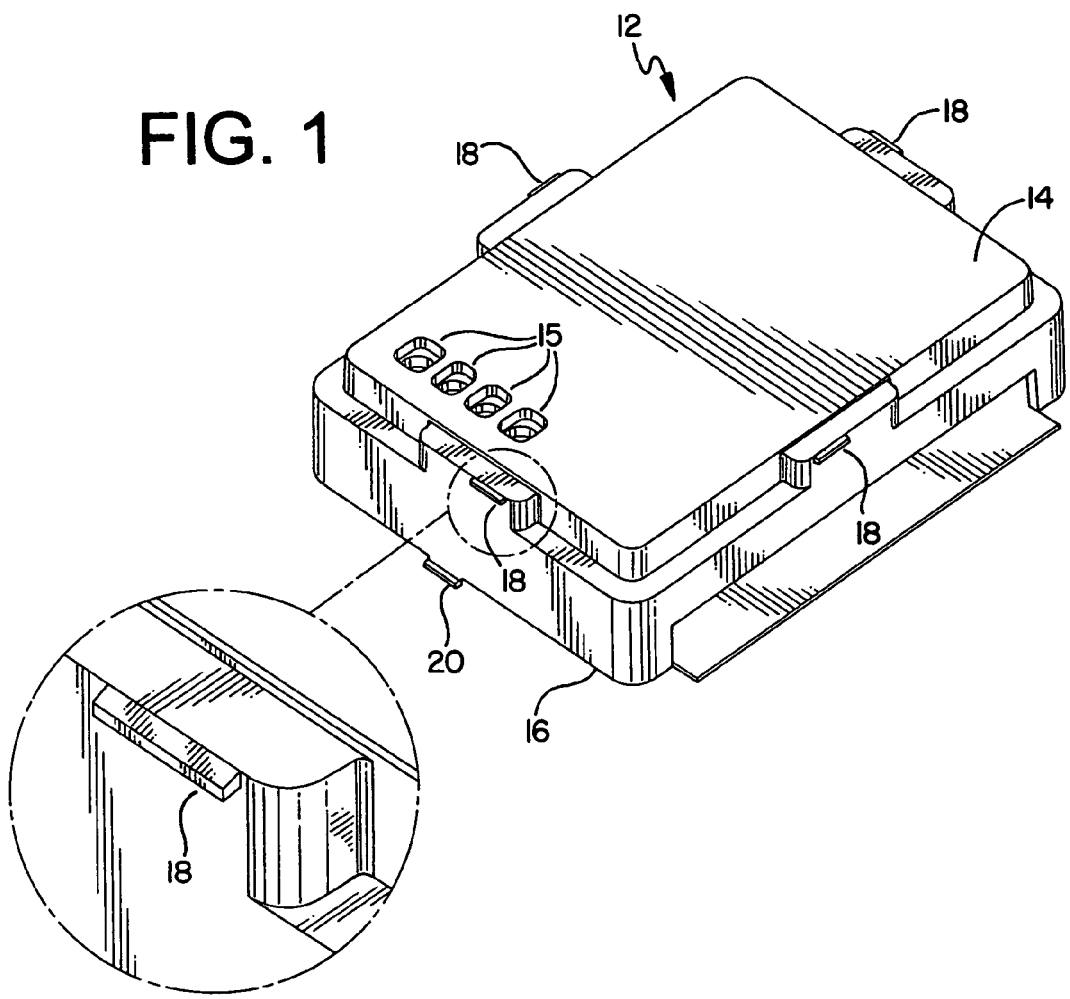
FIG. 1 is a perspective view of a top portion of the case of the present invention.

While this invention is susceptible of embodiment in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

Figure 1A:
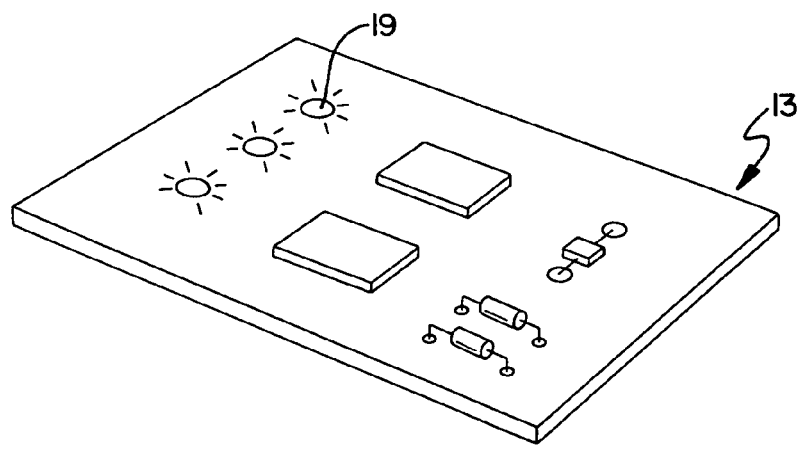
FIG. 1a is a perspective view of a device for placement in the device.

FIG. 1 is a perspective view of a top portion of a case 12 of the present invention. The case 12 provides a housing for an electronic device 13 such as a control or monitoring device, as shown in FIG. 1a. The device 13 has input/output devices 19, such as LED's. The device 13 is mounted in the case 12, and then encapsulated in conventional potting material, positioned so that the input/output devices 19 align with apertures 15.

The case 12 protects and structurally supports the device 13 and potting material to seal the assembly. The case 12 includes a first side 14 and an opposed second side 16. The first side 14 of the case 12 includes a plurality of exterior apertures 15 for input/output devices 19 of the device 13. The case 12 further includes a plurality of case interference snaps 18, 20 designed to secure the case 12 to a frame 22.

Figure 2:
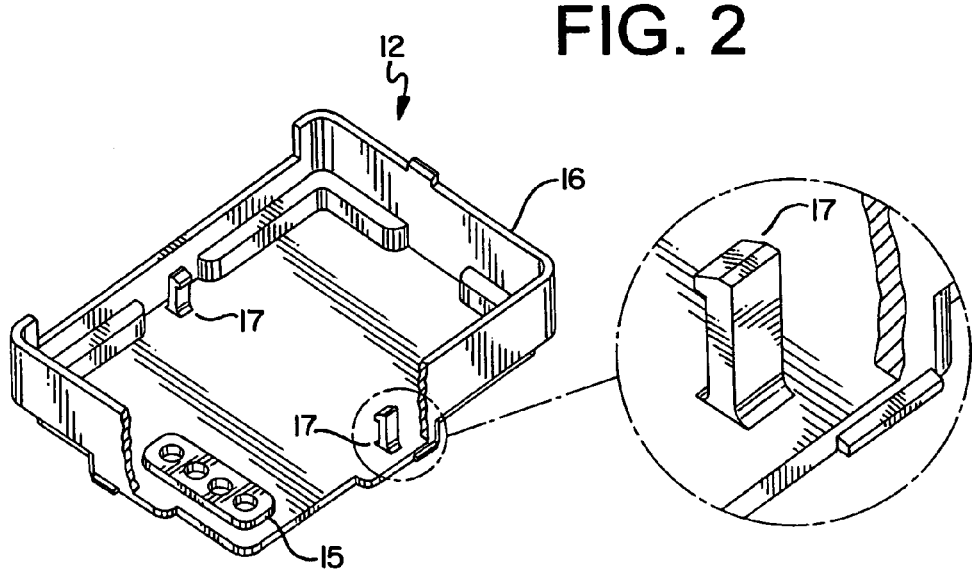
FIG. 2 is a perspective drawing of an underside portion of the case of the present invention.

FIG. 2 is a perspective view of the bottom portion of the case 12. The case 12 includes hooks 17 on the inside of the case 12 to retain the device 13 in position before potting. The potting can be any insulated material for encapsulating the circuit elements. The exterior apertures 15 are sealed prior to potting the device.

Figure 3:
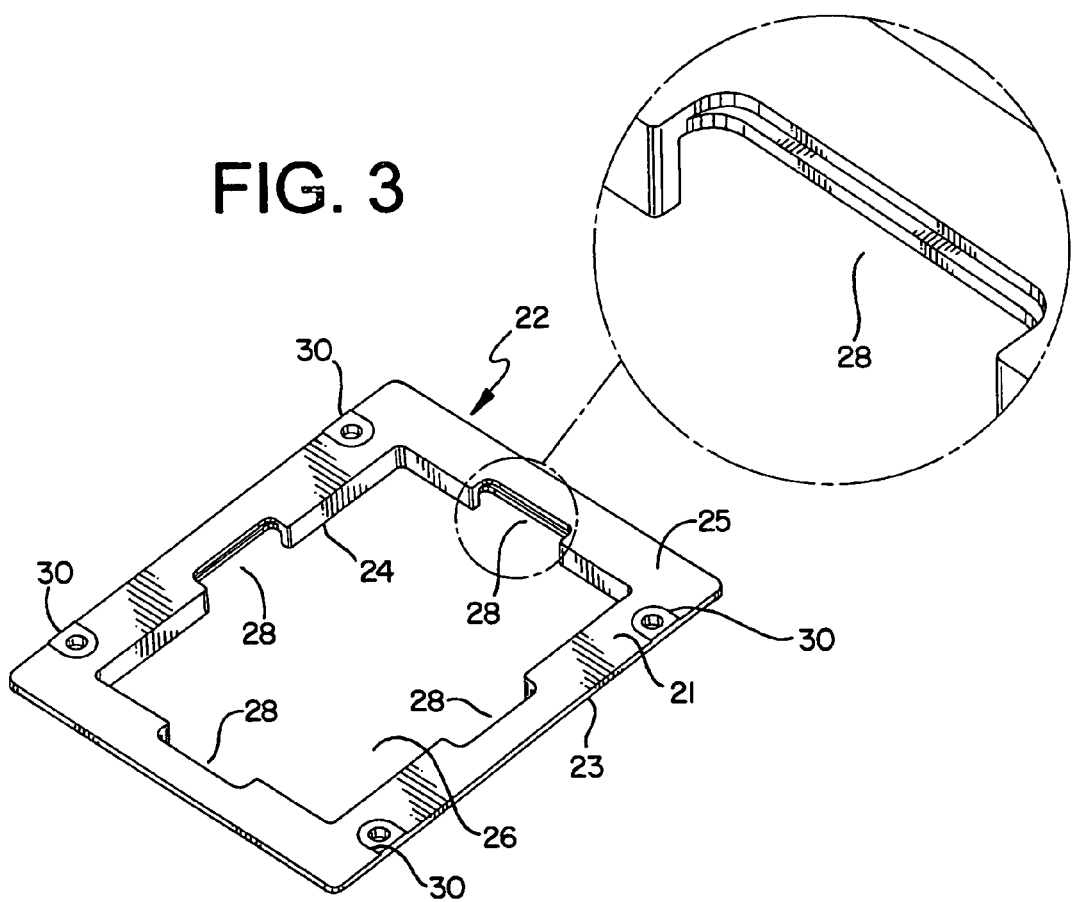
FIG. 3 is a perspective view of a frame of the present invention.

FIG. 3 is a perspective view of the frame 22. The frame 22 attaches to the case 12 to a surface 27, such as a control panel. The frame 22 includes an outwardly extending lip 25. The lip 25 includes a top side lip 21 and a bottom side lip 23. The frame 22 has opposed projecting flanges 24 and a frame aperture 26 inward of the flanges 24. The flanges 24 extend substantially about the aperture 26.

Figure 4:
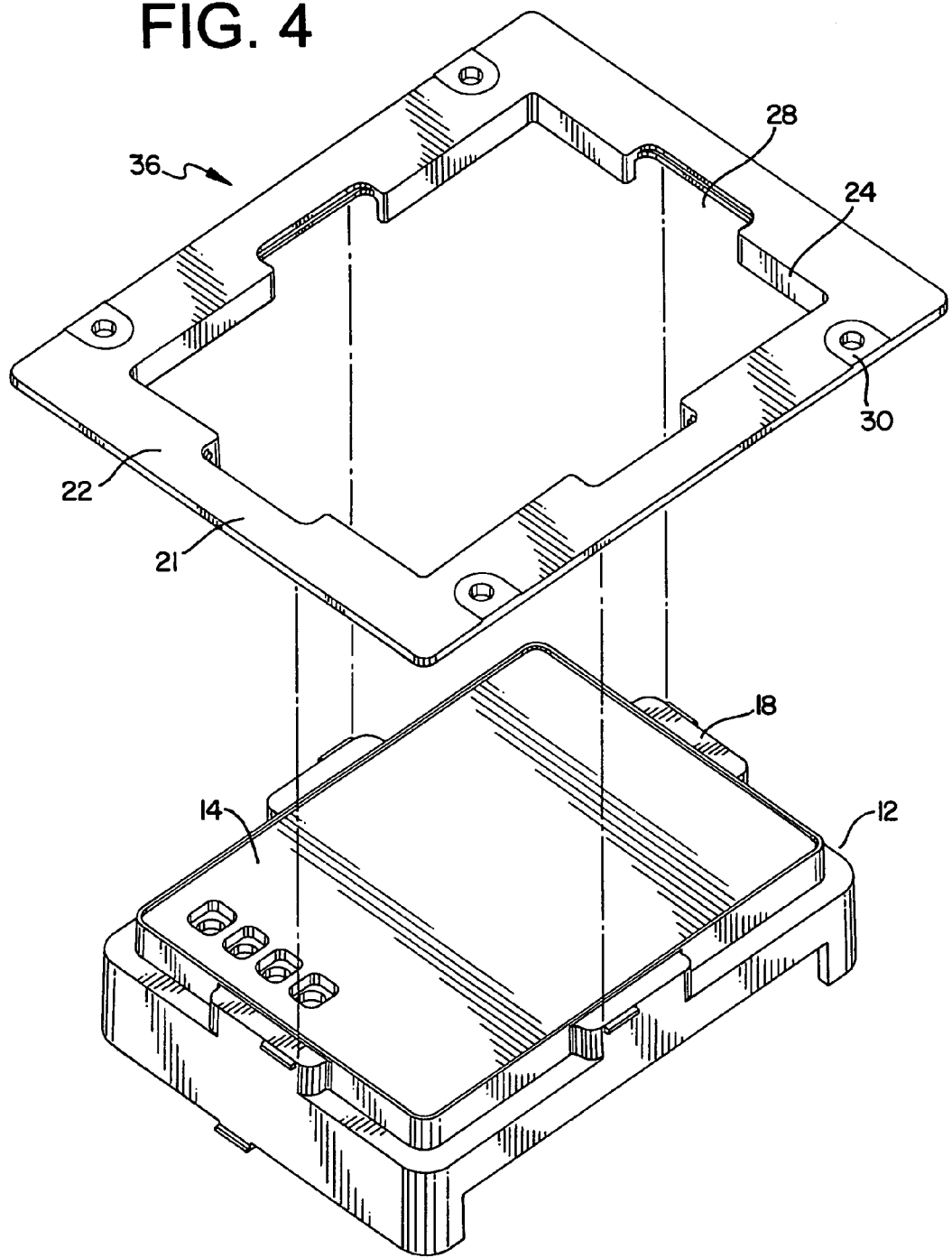
FIG. 4 is an exploded view of the present invention in a flush mounting configuration.
Figure 6:
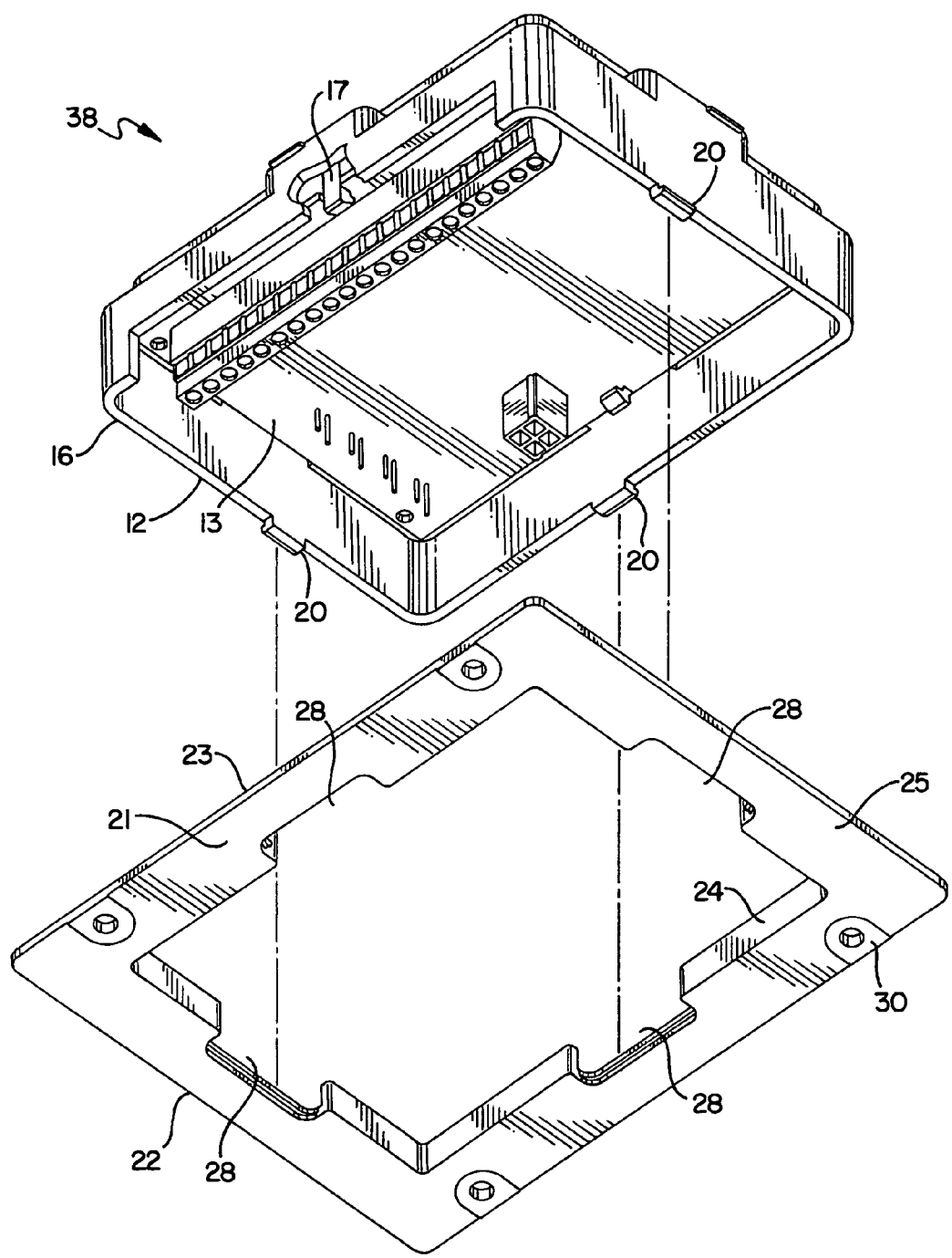
FIG. 6 is an exploded view of the present invention in a base mounting configuration.

FIG. 4 is an exploded view of the present invention in a flush mounting configuration and FIG. 6 is an exploded view of the present invention in a base mounting configuration. The frame 22 includes a plurality of recesses 28 for receiving the case interference snaps 18, 20 of the case 12. The case interference snaps 18, 20 are placed in the appropriate positions on the case 12 and are received in a mating location on the frame 22. The case interference snaps 18, 20 along with the mating flanges 24 on the frame 22 permit for a flush mounting and base mounting configuration. The hooks 17 on the inside of the case 12 retain the device 13 in position before potting. The frame further includes a plurality of fastening apertures 30 for receiving a respective plurality of fasteners for securing the apparatus to a surface 27.

Figure 5:
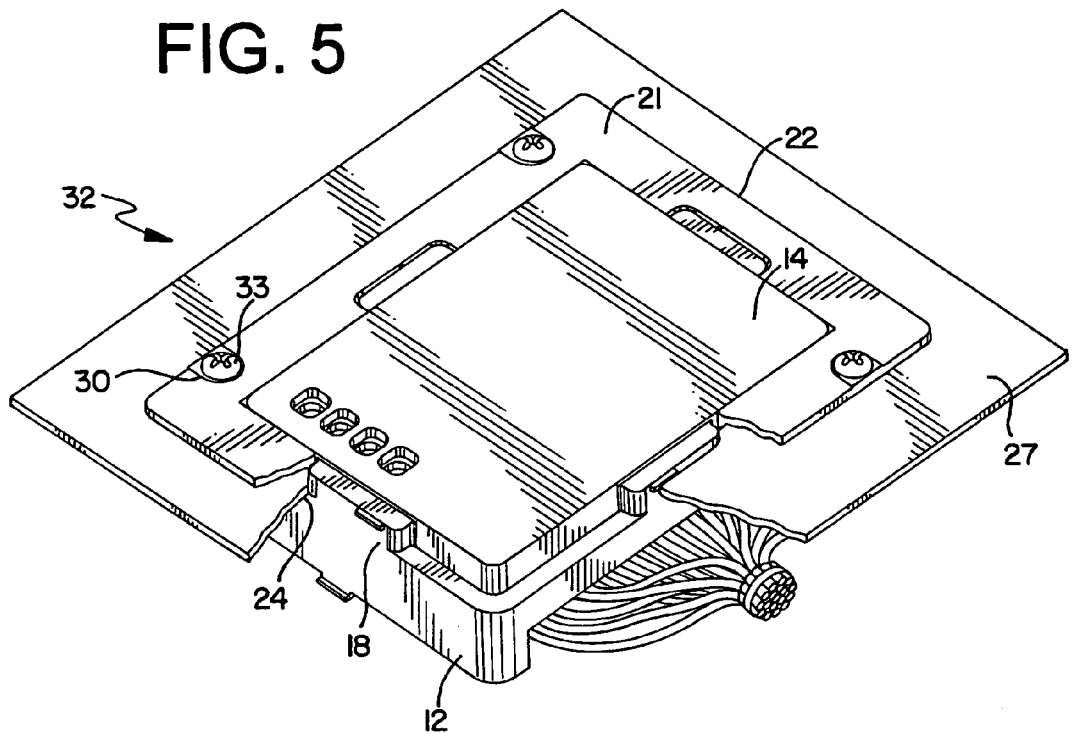
FIG. 5 is an illustration of the present invention in a flush mounting configuration.

FIG. 5 is an illustration of the present invention in a flush mounting configuration 32. The frame 22 is affixed to the case 12 wherein the first side 14 of the case 12 protrudes through the frame aperture 26. The flanges 24 of the frame 22 extend circumferentially about the case 12 wherein the recesses 28 of the flanges 24 are mated with the case interference snaps 18. The flush mounting configuration 32 permits the body of the case 12 to be below the surface 27 in a cutout in the flush surface 27. This requires that only the first side 14 of the case 12 displaying the monitoring functions through the exterior apertures 15 and the top side lip 21 of the frame be exposed in front of the flush surface 27. The flush mounting configuration assembly 32 is secured to the surface 27 by use of a fastener 33 extending through the fastening aperture 30 of the frame 22. A non-exhaustive list of fasteners include screws, push nuts, spring clips, and nails.

Figure 7:
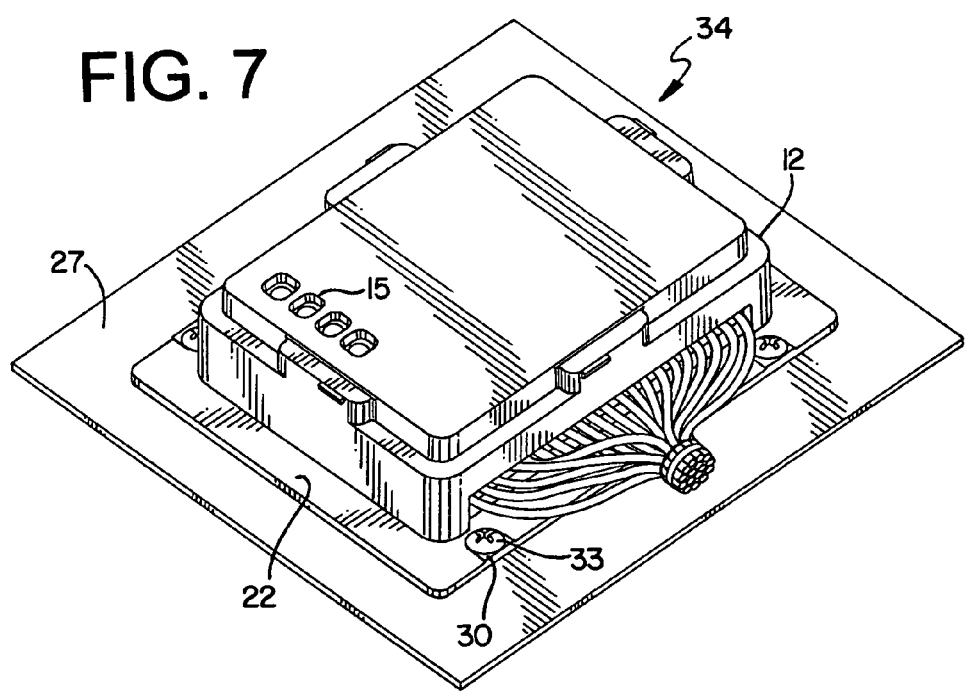
FIG. 7 is an illustration of the present invention in a base mounting configuration.

FIG. 7 is an illustration of the present invention in a base mounting configuration 34. The frame 22 is affixed to the case 12 wherein the flanges 24 extend into the second side 16 of the case 12. The flanges 24 of the frame 22 extend circumferentially about the case 12 wherein the recesses 28 of the flanges 24 are mated with the case interference snaps 20. The base mounting configuration 34 permits the assembly to be mounted above the surface 27. This requires that only the first side 14 of the case 12 displaying the monitoring functions through the exterior apertures 15 and the bottom side lip 23 of the frame 22 be exposed above the base mounting surface 27. The base mounting configuration assembly 34 is secured to the surface 27 by use of a fastener 33 extending through the fastening aperture 30 of the frame 22.

While the specific embodiments have been illustrated and described, numerous modifications come to mind without significantly departing from the spirit of the invention and the scope of protection is only limited by the scope of the accompanying Claims.

I claim:

1. An apparatus for permitting both base and flush mounting of a device to a surface, the apparatus comprising:
   a frame having an aperture and flanges spaced outward of the aperture, wherein a recess exists along each side in between the flanges, the frame including a lip having a plurality of holes dimensioned to receive fasteners;
   a case for housing the device, wherein the case has a first and a second opposed side comprising a plurality of snaps along the circumference of a first side dimensioned to receive the frame, wherein the snaps mate with the recess of the frame in a flush mounting configuration; and
   the case comprising an aperture on a second side dimensioned to receive the frame in a base mounting configuration.

2. The apparatus of claim 1 wherein the second side includes means for displaying a visual output of the device.

3. The apparatus of claim 2 wherein the displaying means is a window.

4. The apparatus of claim 1 wherein the flanges extend substantially about the periphery of the aperture.

5. The apparatus of claim 1 wherein the plurality of holes are used for securing the frame to the surface.

6. The apparatus of claim 1 wherein the case further comprises a retaining means for retaining the device in the case.

7. The apparatus of claim 6 wherein the retaining means comprises a plurality of hooks.

8. The apparatus of claim 1 wherein the device is a monitoring device.

9. The apparatus of claim 1 wherein the device is a control device.

10. The apparatus of claim 1 wherein the recess comprises a plurality of recesses.

11. The apparatus of claim 1 wherein the fasteners include one of screws, push nuts, spring clips, or nails.

* * * * *